(12) United States Patent
Peukert et al.

(10) Patent No.: US 8,362,764 B2
(45) Date of Patent: Jan. 29, 2013

(54) DIAGNOSABLE HALL SENSOR

(75) Inventors: Andreas Peukert, Barnstorf (DE);
Wolfgang Kliemannel, Lemfoerde (DE)

(73) Assignee: ZF Friedrichshafen AG,
Friedrichshafen (DE)

( * ) Notice: Subject to any disclaimer, the term of this patent is extended or adjusted under 35 U.S.C. 154(b) by 286 days.

(21) Appl. No.: 12/934,384

(22) PCT Filed: Apr. 2, 2009

(86) PCT No.: PCT/DE2009/050012
§ 371 (c)(1),
(2), (4) Date: Sep. 24, 2010

(87) PCT Pub. No.: WO2009/121352
PCT Pub. Date: Oct. 8, 2009

(65) Prior Publication Data
US 2011/0018534 A1      Jan. 27, 2011

(30) Foreign Application Priority Data
Apr. 2, 2008    (DE) .......................... 10 2008 000 943

(51) Int. Cl.
*G01R 33/07*    (2006.01)
*G01B 7/30*     (2006.01)
(52) U.S. Cl. ................. 324/251; 324/207.2; 324/207.25
(58) Field of Classification Search ............... 324/207.2, 324/207.25, 251
See application file for complete search history.

(56) References Cited

U.S. PATENT DOCUMENTS

| 6,076,391 A | 6/2000 | Broch |
| 6,734,660 B1 | 5/2004 | Berkcan et al. |
| 6,759,844 B2 | 7/2004 | Kliemannel |
| 2007/0247141 A1 | 10/2007 | Pastre et al. |

FOREIGN PATENT DOCUMENTS

| DE | 196 06 826 A1 | 8/1997 |
| DE | 100 47 994 A1 | 4/2002 |
| DE | 103 26 989 A1 | 1/2005 |
| DE | 10 2006 037 226 A1 | 2/2008 |
| WO | 2008/017348 A3 | 2/2008 |

OTHER PUBLICATIONS

Kayal M; Pastre M: "Automatic Calibration of Hall Sensor Microsystems", Microelectronics Journal, Mackintosh Publications Ltd. Luton, GB, Bd. 37, Nr. 12, Dec. 1, 2006.

*Primary Examiner* — Bot Ledynh
(74) *Attorney, Agent, or Firm* — Davis & Bujold,PLLC

(57) ABSTRACT

A measuring device for determining the strength of magnet fields using a Hall probe and a method for evaluating the function of a Hall sensor. The measuring device comprises a sensor having a Hall probe and an electric diagnosis conductor which is galvanically isolated from the Hall probe. The measuring device being able to continually monitor the sensor. In particular, the sensor can not only be checked qualitatively in regard to function or failure, but also quantitatively in regard to correct calibration such that, if necessary, an immediate correction or re-calibration of the sensor can be performed. In particular, measuring errors for instance, due to a temperature drift or because of mechanical stress of the sensor, can easily be eliminated.

12 Claims, 3 Drawing Sheets

DIAGNOSABLE HALL SENSOR

This application is a National Stage completion of PCT/DE2009/050012 filed Apr. 2, 2009, which claims priority from German patent application serial no. 10 2008 000 943.1 filed Apr. 2, 2008.

FIELD OF THE INVENTION

The invention relates to a measuring device for determining the position of a sensor device with a Hall probe.

BACKGROUND OF THE INVENTION

Hall probes are known in the state-of-the-art. Generally, Hall probes comprise of a conducting sensor surface through which a feed current flows. If a magnetic field is now alternating with the sensor surface through which the current flows, a deviation of the charge carriers takes place, caused by the Lorentz force on the moving electrical charge carriers in the sensor surface, transversal to their direction of movement. Hereby, and the electric field, as well as a measurable electric voltage is created between the two edges on the sides of the sensor surface.

This voltage, known as the Hall voltage, is in proportion to the product of the magnetic flow density of the magnetic field which interacts with the sensor and the feed current which flows through the surface of the sensor. Hereby, by means of measuring the Hall voltage—and having a known feed current—the magnetic flow density interacting with the sensor can be up to a proportional factor, whereby the proportional factor is mainly dependent on the geometric dimensions of the sensor surface.

Such Hall probes or Hall sensors are known, for instance, as integrated Hall sensor components, whereby a processing device follows the actual Hall sensor, which processes the Hall signal provided by the Hall sensor for analysis and generates an output signal, resulting from the Hall signal. The Hall sensor, as well as the processing device, can hereby be integrated in one single enclosure.

Hall sensors can be used, for instance, to calculate the relative position of two mechanical components under a contact-free and wear-free position. Hereby, a Hall sensor is positioned at one of the two mechanical components, while a component which generates a magnetic field, preferably a permanent magnet, is positioned at the other, second mechanical part. During relative movement of the two mechanical components, the strength and/or the angle of the magnetic field lines of the part generates a magnetic field at the location of the Hall sensor, and thus the Hall voltage which is generated by the Hall sensor. Therefore, the change of the relative position of the two mechanical parts can be registered and, in the case of respective calibration of the Hall sensor, can also be measured or quantitatively calculated, respectively.

Basically, there is also a risk with the Hall sensor of a failure of the sensor component, for instance due to an electronic defect. It is also possible that the measured signal is distorted, for instance due to different operating temperatures, interfering, external magnetic fields, and mechanical stress which is transferred to the Hall sensor such that its sensitivity or characteristics, respectively, can change.

If a standard Hall sensor component fails due to such a defect, or distortions of the signal from the Hall sensor are created due to be described conditions, the problem often exists that the functionality of the Hall sensor component cannot be tested in the assembled state, or during the operation, respectively, so that a defect cannot be recognized. Even less options are offered by the state of the art in regard to the diagnosis of the Hall sensor component by itself, but also in regard to the evaluation electronics which are assigned to the Hall sensor and which are often, together with the actual sensor element, positioned in a standardized chip enclosure.

Known from the publication DE 100 47 994 A1 is a Hall sensor component in which diagnosis of the Hall sensor is possible in the assembled state where the current, which flows through the Hall sensor component, is changed in cycles and where the functionality of the sensor is assumed because of the change of the output voltage of the sensor. This teaching, however, only enables recognizing, by way of a quantitative analysis, whether the Hall sensor component and/or the following evaluation electronics function at all, or if a failure of one of the components has occurred. However, it is neither possible to recognize, during a failure, whether the actual Hall sensor component or the evaluation electronic is affected, nor can a quantitative analysis take place in such a way to check whether the output signal of the sensor has been distorted, for example, through external factors. It is also not possible in that teaching to recognize whether, for instance, the Hall sensor component is under mechanical stress, or whether the Hall sensor component has a different malfunction, or if it is indeed a change of the measured magnetic field.

SUMMARY OF THE INVENTION

Based on this background, it is the task of the present invention to create a diagnosable sensor device with a Hall probe, or a method for the functional diagnosis of a Hall sensor device, were a comprehensive diagnosis of the sensor device can be executed. In particular, the invention makes it possible to execute the diagnosis of the Hall sensor component, as well as the evaluation electronics of the Hall sensor component. Furthermore, a qualitative and a quantitative diagnosis of the sensor device is enabled, such that calibration of the sensor device, or elimination of faulty measurements, respectively, which, for instance, occur due to changes in the ambient conditions are made possible.

The measuring device itself serves, as known in the art, for the determination of the field strength of a magnetic field. Hereby, the measuring device comprises a sensor device with at least a Hall probe. In here, the Hall probe is provided to create a Hall voltage depending on the placement of the Hall probe in the magnetic field, as well as depending on the feed current which flows through the Hall probe.

In accordance with the invention, the measuring device is not only characterized by an electrical diagnosis conductor, galvanically isolated from the Hall probe, positioned in an immediate proximity of the Hall probe, but also by a driver device to create a certain electrical diagnosis current through the diagnosis conductor.

The diagnosis conductor, through which a certain electrical diagnosis current is routed by means of the driver device, creates a magnetic field, caused by the diagnosis current, which is then again affecting the Hall probe. Thus, a Hall voltage of a certain size is created in the Hall probe. The Hall voltage which is generated by the diagnosis current can be analyzed and, based on the analysis, conclusions can be drawn in regard to the function of the Hall probe, as well as in regard to the function of the evaluation electronic of the Hall probe.

In particular, a correlation can also be established between the size of the diagnosis current and the size of the hereby created Hall voltage, because a certain size of the diagnosis current has a certain magnetic field strength of the diagnosis conductor associated with it, thus, also a certain nominal value is associated with this magnetic field strength and the related Hall voltage. Therefore, not only qualitative but also quantitative conclusions can be made with regard to the functionality of the Hall probe or its evaluation electronic, respectively. Through a corresponding, exact analysis, even calibration of the Hall probe or the measuring device can take place by calculating a corresponding correction value from the known value of the diagnosis current, the value of the hereby created Hall voltage, and from the nominal value of the Hall voltage related to the diagnosis current. Hereby, compensation for the temperature of the Hall probe can take place, so that the accuracy, reliability, and temperature stability of the Hall probe can be significantly improved.

Through the inventive measuring device, diagnosable magnetic field sensors are created which can preferably be used in applications where, due to safety reasons, reliable detection of sensor failure is required, for instance, to prevent injuries and damage to persons or property caused when sensors fail.

Different from the state of the art, the inventive measuring device is also capable of testing the functionality of the Hall probe and the evaluation electronics without the need for an external magnetic field as it is the case in the named state of the art. In fact, for diagnosis in this invention the underlying magnetic field itself is created through the diagnosis conductor and the diagnosis current which provides an additional advantage, in that the field strength of the diagnosis magnetic field is known, or can be adjusted as required. Thus for instance, mechanical stress of the Hall probe can also be detected and be diagnosed, because it creates a corresponding distortion of the Hall voltage, which can be recorded, in accordance with the invention, due to the known diagnosis current and the known diagnosis magnetic field.

The galvanic isolation between the diagnosis conductor and the Hall probe contributes to an especially reliable diagnosis and to protection of the Hall probe from the diagnosis voltage or the diagnosis current, respectively.

First, the invention can be enabled independent of the kind and value of the diagnosis current, as long as the variables which determine the diagnosis current are known, through which also the field strength of the diagnosis magnetic field and the nominal value of the Hall voltage which is generated by the diagnosis magnetic field, can be calculated.

In accordance with an especially preferred embodiment of the invention, the diagnosis current, however, shows a cyclical change of the amperage which is commonly known or the diagnosis current has an overlay of a defined, known pulse pattern. Hereby, it is advantageously possible to split the Hall voltage, which is created by the Hall probe, into a measured partial voltage and a diagnostic partial voltage. This is advantageous because a complete, and if necessary, a quantitative diagnosis of the Hall probe can be executed if external magnetic fields or interfering magnetic fields of known or unknown size are present.

Especially at the time when the diagnosis current is present in the form of a known pulse pattern, a corresponding pulse pattern can also be seen on the Hall voltage created by the Hall probe. Based on the number and especially the amplitude of the pulses in the Hall voltage, separation of a measuring signal, which has a superimposed diagnosis signal, and the measured signal itself can be performed. Especially, the amplitude of the pulses present in the Hall voltage can be measured, whereupon the basis of the measured amplitude, as well as on the basis of the known amplitude of the diagnosis current, a complete diagnosis of the measuring device or the Hall probe, respectively, can again be executed as described above.

In accordance with an additional, especially preferred embodiment of the invention, the Hall probe and the diagnosis conductor are positioned together in a Hall enclosure or molded, respectively. In particular, it can be a chip enclosure which accommodates the Hall probe and its measuring electronics, as well as the diagnosis conductor. This has the advantage that the relative position between the diagnosis conductor and the Hall probe is exactly fixed and is non-changeable, so that calibration of the magnetic field itself, which is generated by the diagnosis conductor in the area of the Hall probe, does not have to be performed. In addition, it provides optimum protection of the diagnosis conductor and an optimum handling of the sensor device.

An additional, preferred embodiment of the invention provides that the sensor device is designed as an integrated current measuring sensor. This means in other words that the diagnosis conductor is designed with a shunt resistor or measuring shunt, respectively, which is positioned in the chip enclosure of the current measuring sensor, whereby the current measuring sensor, in this case, is not used for measuring an unknown current value, but it serves by means of a default value of a known current in form of the diagnosis current to measure a magnetic field of an unknown size, and simultaneously serves for the diagnosis of the sensor and the measuring electronic.

In accordance with an additional, especially preferred embodiment of the invention, the measuring device is designed with an additional magnet that is movably positioned relative to the sensor device or the Hall probe, respectively. Hereby, due to the Hall voltage of the Hall probe, which is generated by the magnetic field of the magnet, the relative position or distance between the sensor device and the magnet can be determined. Preferably, the sensor device and the magnet are rotationally positioned to each other or movably positioned to each other, respectively.

The measuring device can be generally utilized to determine the relative position of two relatively moving mechanical parts, where the sensor device is positioned at one of the moving parts and the magnet is positioned at the other of the two moving parts.

Based on this background, a possible and preferred field of application is generated for the inventive measuring device in the area of the motor vehicle electronics, especially in actuation devices for shift-by-wire controlled change speed gear transmission of motor vehicles. The Hall probe measuring devices are especially useful for low-wear and low-friction determination of shift positions of the actuating levers.

Such actuating devices can have—for the determination of the actual shift condition of the transmission actuation lever in the passenger compartment—a magnet positioned at the actuation lever which creates in a certain shift position a magnetic field of a determined size in the effective range of the sensor device or the Hall probe of the sensor device.

If the inventive measuring device is used in a motor vehicle, malfunctions or a failure of the sensor device can readily be determined and diagnosed through diagnosis electronics which are present in the motor vehicle. It is also possible, by means of the diagnosis electronics which are present and the vehicle, to continually monitor the functionality of the Hall sensor device which is used in the transmission actuating device and to correct it if necessary. If malfunctions or failures of the sensor device are recognized, it is possible to signal these to the driver or to run a safety program assigned to the failure. Thus, possible incorrect actuation of the transmission can be prevented and, therefore, possible harm to the driver or damage to the vehicle can be averted.

In addition, the invention relates to a method for a functional diagnosis of a Hall sensor device. Hereby, the Hall sensor device comprises at least a Hall probe, a diagnosis conductor which is galvanically isolated from the Hall probe, as well as a driver device. The driver device serves hereby for an overlay of a changeable, electric diagnosis current with any predetermined amplitude pattern on the diagnosis conductor. The inventive method comprises the following described steps of the method.

Initially, the control electronics of the sensor device generates a defined feed current which flows through the Hall probe as a prerequisite for the measurement of Hall voltages.

Thereafter, the overlay of the electric diagnosis current on the diagnosis conductor takes place in a next step of the method. This means in other words that a corresponding driver circuit makes sure that the electric diagnosis current, which can be altered and which has a predetermined period, is injected into the diagnosis conductor. The order of the first two steps of this method is optional or insignificant.

Hereafter, determination of the Hall voltage which has been generated by the Hall probe takes place in a next step of the method, which then splits the Hall voltage in to the measured partial voltage and the diagnosis partial voltage. The splitting of the Hall voltage into the measured partial voltage and the diagnosis partial voltage can basically take place through simple changes, because the amplitude pattern of the diagnosis current is known, thus, the nominal value on the Hall voltage, which is created by the diagnosis current, is known. Through changes between the Hall voltage, which is generated by the Hall probe, and the nominal value of the Hall partial voltage, which is created by the pulsing diagnosis current, the measuring partial voltage of the Hall probe can therefore be determined.

Thus, the measured partial voltage—as a measure of a magnetic field which affects the Hall probe—as well as the diagnosis partial voltage—as a measure of the magnetic field which is generated by the diagnosis current—are known and can therefore be separately analyzed in an additional step of the method.

The inventive method therefore enables continual diagnosis of the Hall sensor device during normal operation. Because of the overlay of the diagnosis magnetic field, generated through the diagnosis current and the diagnosis conductor, with a possible, external magnetic field, for instance from a permanent magnet and the following separation of the signal of the Hall probe into the diagnosis partial voltage and the measured partial voltage, interaction between the measured signals and the diagnosis signals is not possible.

Due to the inventive method, not only can a qualitative diagnosis take place, like whether the Hall sensor device properly functions or does not function, but also quantitative diagnosis can determine if the signal of the Hall probe is correct and if it is proportional to the respective present magnetic field. For that reason, the invention also enables continual monitoring and, if necessary, calibration of the Hall probe. For example, this might be required if imprecise signals occur because of temperature drift or because of mechanical stress in the Hall probe.

The inventive method can initially be realized independently from the amplitude pattern of the changeable electric diagnosis current, as long as the pattern is known, or can be exactly predetermined, respectively, and thus, the diagnosis partial voltage can again be differentiated from the measured partial voltage.

In accordance with an especially preferred embodiment of the inventive method, the electric diagnosis current, however, has a pulse shaped amplitude pattern. The pulse shaped amplitude pattern is especially advantageous because the pulses can be recognized, due to the steep rise and fall of the signal edges, in a simple and exact way in the output signal of the Hall probe, and can therefore reliably be separated from the measuring partial voltage.

In accordance with additional, preferred embodiments of the inventive method and as part of the analysis of the output signals of the Hall probe the number of pulses which have been received during a predetermined time interval or the amplitude of the pulses can be analyzed, respectively. The analysis of the number of pulses can hereby be performed especially within the scope of a simpler, qualitative diagnosis of the Hall sensor device, in which a failure of the sensor device can be concluded, if within a certain, determined time the same number of pulses cannot be recorded, compared to the corresponding number of pulses which were input into the diagnosis current. In contrast of the latter, the analysis of the pulse amplitude of the diagnosis partial voltage especially enables quantitative diagnosis, or calibration of the sensor device, respectively, as described above.

With the application of the inventive method to a motor vehicle, especially in the area of actuating a speed gear change transmission by means of an actuating element, additional preferred embodiments of the invention provide that a magnet be positioned at a movable part relative to the sensor device. Hereby, based on the measured partial voltage, a determination of the relative position between the sensor device and the magnet is performed. Preferably, the position of the selector lever of a speed gear change transmission of a vehicle is determined, by positioning the sensor device or magnet at a base or at the selector lever, such that during movement of the selector lever, relative movement between the sensor device and the magnet takes place. This relative movement creates a change of the effective magnetic field of the magnet in the area of the sensor device or in the area of the Hall probe of the sensor device, whereby—after a respective calibration—the corresponding relative position between the selector lever and the base of the actuating device can be determined.

BRIEF DESCRIPTION OF THE DRAWINGS

In the following, the invention is further explained by the drawings which present embodiment examples. It is shown in.

DETAILED DESCRIPTION OF THE PREFERRED EMBODIMENTS

Figure 1:
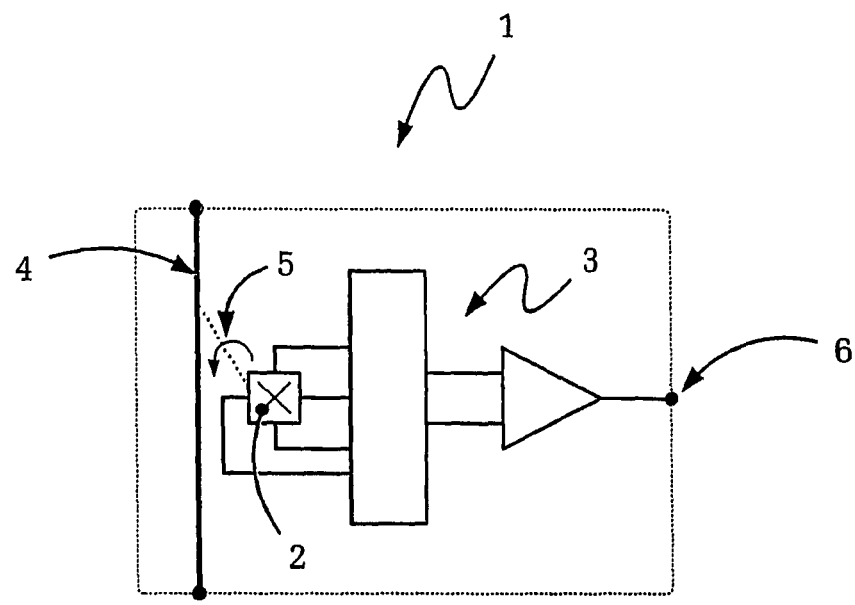
FIG. 1 a schematic view of a sensor device of a measuring device in accordance with an embodiment of the present invention.

FIG. 1 shows, in a highly schematically represented circuit, the sensor device 1 of a measuring device in accordance with an embodiment of the present invention, Initially, the Hall probe 2 can be seen, with its four edges being connected in a common way with an electronic supply and analysis circuit 3. Hereby, the necessary current can be supplied to the Hall probe 2 to create the Hall effect, and when magnetic fields become present at the edges of the Hall probe 2, which run in parallel to the feed current, the corresponding Hall voltage can be detected and registered.

The presented sensor devise 1 comprises a diagnosis conductor 4, which is galvanically isolated from the Hall probe 2 and fed by a driver device 8 (not shown in FIG. 1, compare to FIG. 2) in a way such that certain electric diagnosis current flows in the diagnosis conductor 4.

The diagnosis current which flows through the diagnosis conductor 4 enables the creation of a magnetic field 5 around the diagnosis conductor due to the diagnosis current. This magnetic field 5 penetrates also the Hall probe 2 and leads to the generation of a corresponding Hall voltage at the two edges of the Hall probe 2, which are parallel to the feed current.

The Hall voltage is entered into the evaluation circuit 3 of the sensor device, amplified, and is transmitted as a corresponding signal to the output 6 of the sensor device.

Figure 2:
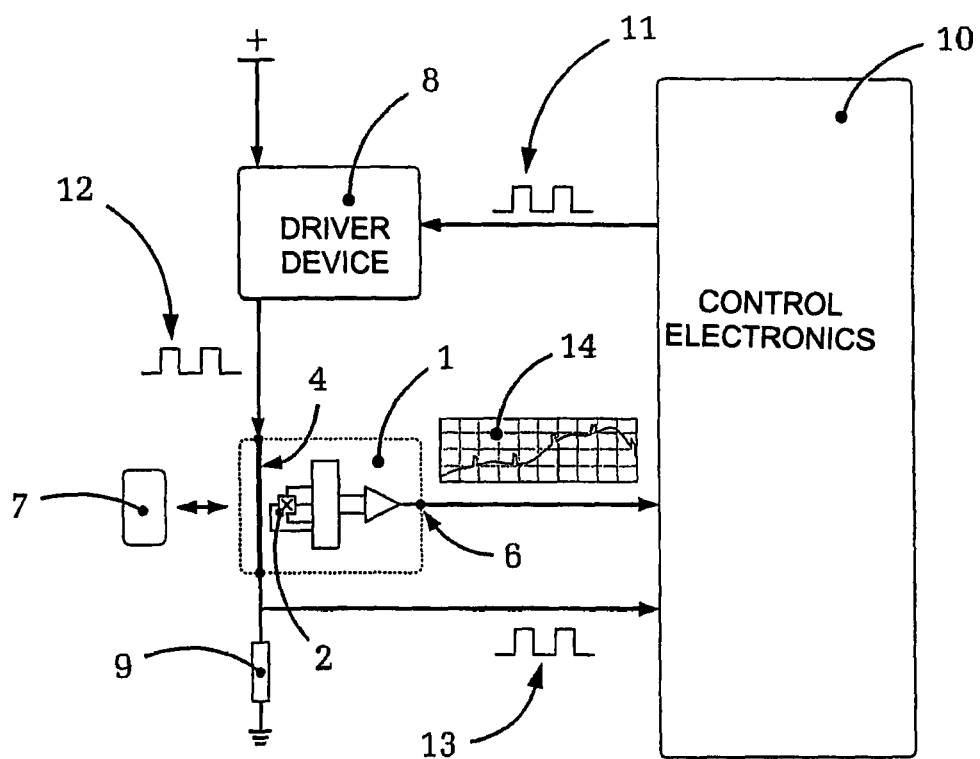
FIG. 2 a corresponding presentation of an embodiment as in FIG. 1 of a measuring device in accordance with the present invention.

FIG. 2 shows how the sensor device 1 in FIG. 1 is incorporated into the inventive measuring device. Besides the sensor device 1 in accordance with FIG. 1, FIG. 2 shows a magnet 7 that is movable relative to the sensor device 1. The magnet 7, for instance, can be positioned at a selector lever of an actuation device in a speed change gear transmission, while the sensor device 1 is positioned at the enclosure or a base of the actuating device.

Besides the sensor device 1, the measuring device comprises a driver device 8, a pre-resistor shunt 9, and control electronics 10. The control electronics 10 coordinate all the sequences which are necessary for the diagnosis of the sensor device 1, in accordance with the invention. It includes, in the first instance, the control of the driver device 8 through a square wave signal 11 which is generated in the control electronics 10. The square wave signal 11 is amplified by the driver device 8 and is, in the form of a pulsing diagnosis current 12, added as an overlay to the square wave amplitude pattern of the assigned diagnosis conductor 4 in the sensor device 1. For the limitation of the current which flows through the diagnosis conductor 4, as well as for the determination of the amount of the current which flows through the diagnosis conductor 4, the measuring device comprises a shunt 9. At the shunt 9, a control voltage 13 is established which is pulse shaped and proportionally corresponds with the pattern of the diagnosis current 12, and which is then transferred to the control electronics 10.

In addition, the control electronics 10 is also connected to the output 6 of the sensor device 1 so that also the respective, amplified signal 14 of the Hall probe 2 is transferred to the control electronics 10. The output signal 14 from the sensor device 1 of the Hall probe 2 represents a summation signal 14, which corresponds to an overlay of the magnetic fields of the magnet 7 and the diagnosis conductor 4, which is present at the location of the Hall probe 2.

Because of the known characteristic of the driver device 8, and because of the measured diagnosis current 12 which flows through the shunt 9, the amount of current flowing through the diagnosis conductor 4, and therefore also the size of the magnetic fields 5 which is created by the diagnosis conductor 4 in the area of the Hall probe 2, is known. Due to these known correlations, the nominal diagnosis signal which is generated by the Hall probe 2 can be calculated and it can also be again eliminated or separated, respectively, from the summation signal 14 through an overlay of the summation signal 14 generated by the Hall probe 2, which creates a pure analog signal of the Hall probe which was caused earlier by the magnet 7.

Figure 3:
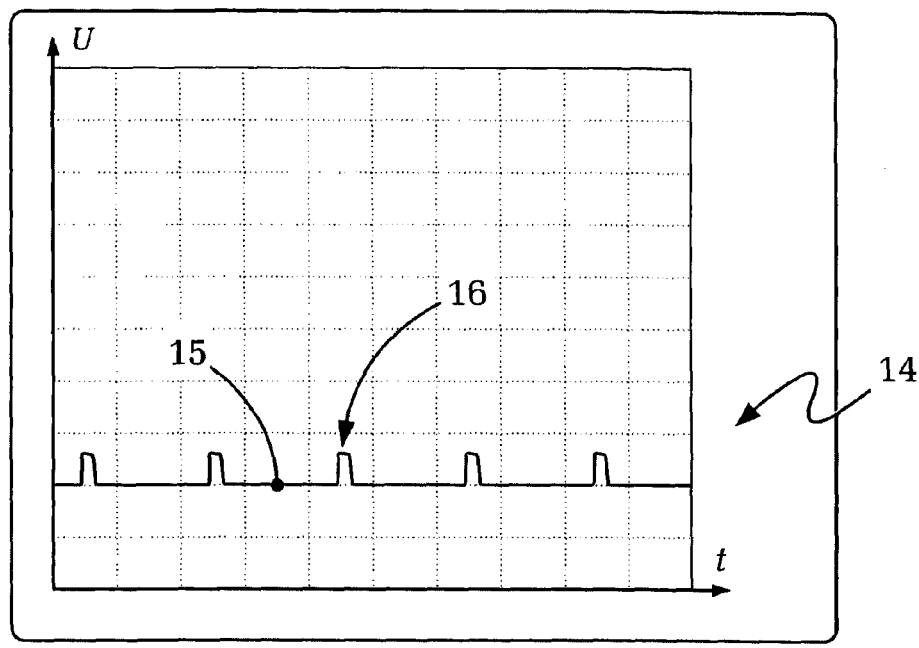
FIG. 3 a schematic diagram of the output voltage of the Hall probe of the measuring device in accordance with FIG. 2 in an idling condition.
Figure 4:
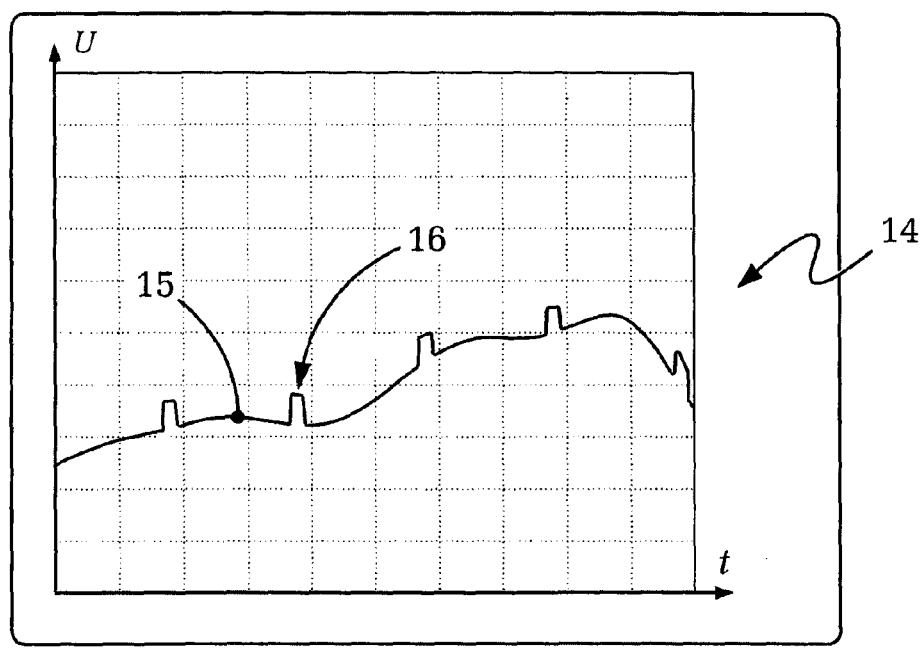
FIG. 4 a corresponding presentation as in FIG. 3 of the output voltage of the Hall probe of the measuring device in accordance with FIG. 2 and FIG. 3 during operation.

FIG. 3 and FIG. 4 show examples of the summation signal 14 which was issued by the sensor device 1, whereby the summation signal 14, as explained above, is initially created by an overlay of the magnetic fields of the magnet 7 and of the diagnosis conductor 4.

FIG. 3 shows the output voltage or the summation signal 14, respectively, of the sensor device 1 in the condition of a standstill of the magnet 7, relative to the sensor device 1, also, as an example, the signal of the sensor device 1 of an actuating device in a gear speed change transmission when the actuating lever is not moved. It can be seen that the measured signal 15, along the Y-axis, and as part of the summation signal 14 remains constant over the time. From the amplitude of the measured partial voltage 15 of the summation signal 14, a conclusion can be drawn in regard to the distance between the magnet 7 and the sensor device 1, in the example for the absolute position of the transmission actuation lever.

Also the pulsating diagnosis partial voltage 16 can be recognized, overlaid with the measured partial voltage 15 and resulting from the pulsating diagnosis current 12 which flows through the diagnosis conductor 4. By the presence and amplitude of the pulses of the diagnosis partial voltage 16, a conclusion regarding the functionality and correct calibration of the sensor device 1 can be made, in accordance with the invention, since the amount of the diagnosis current 12, thus the size of the magnetic field by created the diagnosis current 12, and thus also the nominal value of the created diagnosis signal is known, it can be compared with the actual value of the diagnosis signal 16.

FIG. 4 shows the summation signal 14 of the sensor device 1 as it arises in the case of non-uniform movement of the magnet 7, relative to the sensor device 1, or in the case of corresponding movement of a transmission actuation lever which is equipped with the sensor device 1. Again, the summation signal 14 comprises, on the one hand, the overlay of the measured partial voltage 15, which results from the magnetic field of the magnet 7, on the other hand, the diagnosis partial voltage 16 which results from the pulsating magnetic fields 5 of the diagnosis conductor 4.

Also in this case, based on the known nominal value of the amplitude of the diagnosis signal 16, the calculated separation of the signals 15 and 16, created by the magnet 7 or the diagnosis current 12, respectively, can be performed and the two signals 15 and 16 can be analyzed separately. Thus, based on the analysis of the pulsating diagnosis partial voltage, determinations can be made in regard to the functionality and the calibration of the sensor device 1, while based on the amplitude of the measured partial voltage 15 of the summation signal 14, the distance between the magnet 7 and the sensor device 1 or the relative position of an actuation lever relative to the sensor device 1 can be calculated respectively.

In particular, by comparing the actual diagnosis partial voltage 16 of the sensor device 1 with the calculated nominal diagnosis signal of the control electronics 10, a quantitative diagnosis or calibration of the sensor device 1 can be performed respectively. For instance, if the amplitude of the actual diagnosis signal 16 is larger than the calculated or stored nominal value of the amplitude, an appropriate correction (in this case a reduction) of the feed current which flows through the Hall probe 2 can take place, until the measured actual value of the amplitude of the diagnosis partial voltage 16 again matches with the nominal value. Therefore, for example, temperature drift of the Hall probe 2 or mechanical stress of the Hall probe 2 can be recognized and, if necessary, automatically be compensated which improves significantly the reliability and measuring accuracy of the measuring device.

Figure 5:
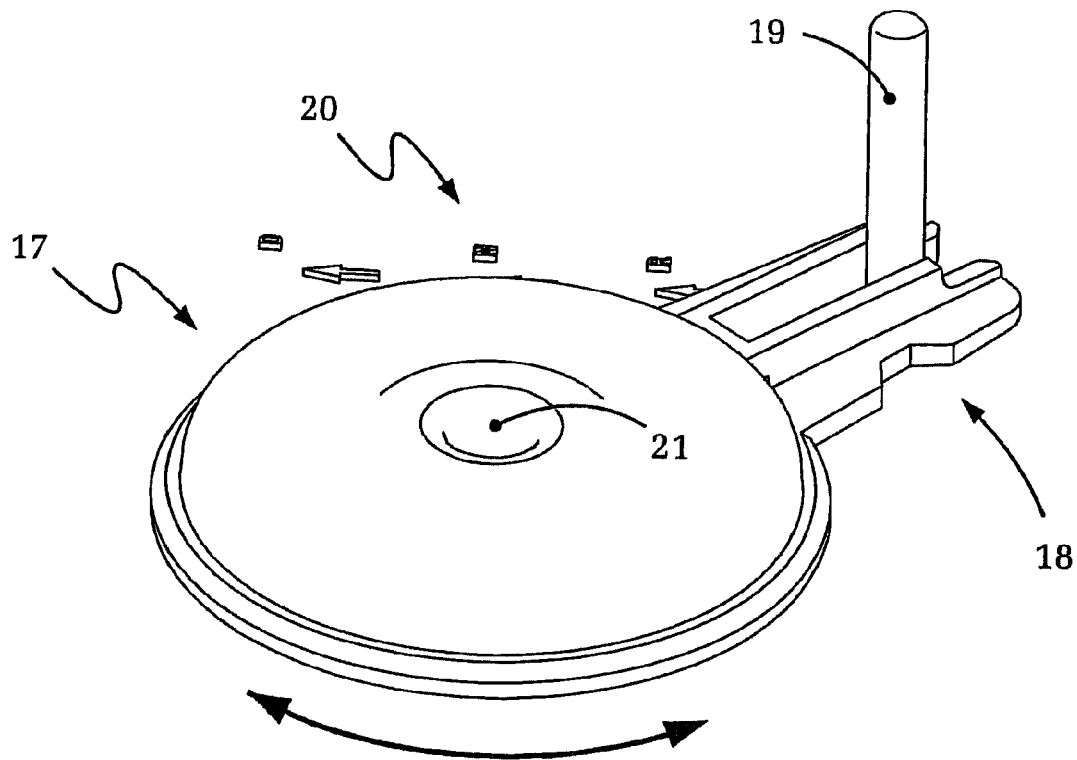
FIG. 5 an isometric view of a sensor device and the magnet of a measuring device in accordance with the invention.
Figure 6:
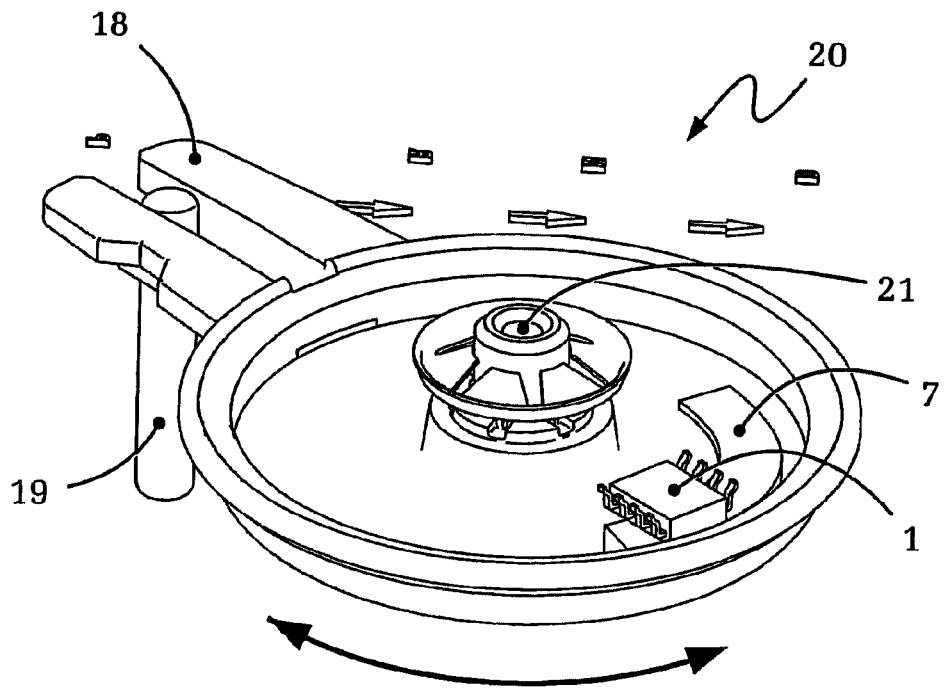
FIG. 6 a corresponding presentation in accordance with FIG. 5, showing the configuration of the sensor device and the magnet in accordance with FIG. 6, in a bottom view.

FIGS. 5 and 6 show an additional embodiment of the measuring device in accordance with the present invention. Initially, a pan shaped enclosure 17 can be seen which is preferably constructed from metal, to provide optimum shielding of the sensor device 1 against interfering fields. The enclosure 17 meshes, via a bracket 18, with a movable coupling pin 19, the movable coupling pin 19 is connected with a selector lever (not shown) of a speed change gear transmission and therefore follows the movements of the selector lever.

During movements of the selector lever between the different shift steps P-R-N-D, which are represented in FIGS. 5 and 6 by the respective characters 20, the enclosure 17 is turned accordingly around the enclosure bearing 21 by means of the bracket 18.

FIG. 6 indicates that a permanent magnet 7, shaped as a segment of a circle, is positioned in the inner part of the enclosure 17, and is in the form of an inclined plane, with increasing thickness along its segment of circular shape. The permanent magnet 7 affects the sensor device 1, also visible in FIG. 6, which is not connected to the enclosures 17, but is for example, connected to a base of the actuating device (not shown here). During rotation of the enclosure 17 and the permanent magnet 7, which is connected to the enclosure, the effective distance between the permanent magnet 7 and the sensor device 1 is proportional to change in the angle of rotation of the enclosure.

Accordingly, also the level of the sensor signal 14 changes, in particular the level of the measured partial voltage 15 of the sensor device, compare for instance FIG. 4. Thus, based on the analysis of the measuring partial voltage 15 of the sensor 1, the angle of rotation position of the enclosure 17 can be determined. Hereby, due to the inventive, continually separate analysis of the diagnosis partial signal 16, can be made and, if necessary, an automatic calibration of the sensor 1 can be performed, as explained above. Also, the functionality and possible failures of the sensor device 1 can be continually monitored, and if necessary, possible emergency programs can be initiated during a failure or the user can be notified accordingly.

If necessary, the sensor device 1, in the sense of a further increase of the system availability, redundancy, and reliability, can also be double installed. Meaning in other words that at least the sensor device 1, comprising the Hall sensor 2 and the diagnosis conductor 4, are present in a redundant way. The control electronics 10 can, due to cost reasons, be present as a single unit, whereby in this case the number of sensor contacts of the control electronics 10—in accordance with the a dual sensor device 1—are also doubled.

If hereby—in the case of redundant sensor devices 1—a failure occurs in one of the sensors, the system is still fully functional despite the sensor failure, and the signal of the failed sensor can be fully corrected or replaced, respectively, due to the inventive diagnostic ability by means of the second sensor.

The result makes it clear that the invention has created a diagnosable sensor device or a method, respectively, for the functional diagnosis of a sensor device, which presents significant advantages, especially in regard to reliability and measuring accuracy. The inventive sensor device and the inventive method enable the complete and continual, quantitative diagnosis and calibration of a Hall sensor component, such that measurement errors, for instance due to temperature drift or mechanical stress, can be eliminated.

REFERENCE CHARACTERS

1 Sensor Device
2 Hall Probe
3 Evaluation Circuit
4 Diagnosis Conductor
5 Magnetic Field
6 Output
7 Magnet
8 Driver Device
9 Pre-Resistor, Shunt
10 Control Electronics
11 Square Wave Signal
12 Diagnosis Current
13 Control Voltage
14 Summation Signal
15 Measured Partial Voltage
16 Diagnosis Partial Voltage
17 Enclosure
18 Bracket
19 Coupling Pin
20 Shifting Steps P-R-N-D
21 Bearing

The invention claimed is:

1. A measuring device for determining a strength of a magnetic field, the measuring device comprises:
   a sensor device (1) with at least a Hall probe (2), the Hall probe (2) being designed for generating a Hall voltage (14), depending on a magnetic field (5), which penetrates the Hall probe (2), and a feed current flowing through the Hall probe (2),
   an electrical diagnosis conductor (4) being galvanically isolated from the Hall probe (2),
   a driver device (8) for generating an electric diagnosis current (12) which flows through the diagnosis conductor (4), and
   a magnet (7) being movably positioned, relative to the sensor device (1), such that, based on the Hall voltage (14) of the Hall probe (2), a determination of the relative position, between the sensor device (1) and the magnet (7), is performed.

2. The measuring device according to claim 1, wherein the diagnosis current (12) has a cyclically altering, known amperage.

3. The measuring device according to claim 1, wherein the diagnosis current (12) has an overlay of a defined, known pulse pattern.

4. The measuring device according to claim 1, wherein the Hall probe (2) and the diagnosis conductor (4) are located together in a probe enclosure (1).

5. The measuring device according to claim 1, wherein the sensor device (1) is a Hall effect based, integrated current sensor.

6. The measuring device according to claim 1, wherein the sensor device (1) and the magnet (7) are rotatably positioned relative to one another.

7. The measuring device according to claim 1, wherein the sensor device (1) and the magnet (7) are shiftably positioned relative to one another.

8. A method for a functional diagnosis of a Hall sensor device where the Hall sensor device (1) comprises at least a Hall probe (2), which is galvanically isolated from the Hall probe (2), a diagnosis conductor (4), and a driver device (8) to overlay a changeable electric diagnosis current (12) with a predefined period on the diagnosis conductor (4), the method comprising the following steps:
- creating an electric feed current flowing through the Hall probe (1);
- overlaying of the electric diagnosis current (12) in the diagnosis conductor (4);
- determining a Hall voltage (14) of the Hall probe (2);
- separating the Hall voltage (14) into a measured partial voltage (15) and a diagnosis partial voltage (16);
- analyzing an amplitude pattern of the diagnosis partial voltage (16) for diagnosing the Hall sensor device (1); and
- determining a position of a selector lever of a gear speed change transmission of a vehicle.

9. The method according to claim 8, further comprising the step of providing the electric diagnosis current (12) with a pulse shaped amplitude pattern.

10. The method according to claim 8, further comprising the step of performing an analysis of an amount of pulses in the diagnosis partial voltage (16) within a predetermined time interval.

11. The method according to claim 8, further comprising the step of performing an analysis of pulse amplitudes of the diagnosis partial voltage (16).

12. A method for a functional diagnosis of a Hall sensor device where the Hall sensor device comprises at least a Hall probe, which is galvanically isolated from the Hall probe, a diagnosis conductor, and a driver device for overlaying a changeable electric diagnosis current with a predefined period on the diagnosis conductor (4), the method comprising the following steps:
- creating an electric feed current flowing through the Hall probe;
- overlaying of the electric diagnosis current in the diagnosis conductor;
- determining a Hall voltage of the Hall probe;
- separating the Hall voltage into a measured partial voltage and a diagnosis partial voltage;
- analyzing an amplitude pattern of the diagnosis partial voltage for diagnosing the Hall sensor device; and
- positioning a magnet, at a movable part, relative to the sensor device and determining, with the measured partial voltage, a relative position between the sensor device and the magnet.

* * * * *